US012646581B2

(12) United States Patent
Li et al.

(10) Patent No.: US 12,646,581 B2
(45) Date of Patent: Jun. 2, 2026

(54) ADAPTIVE WRITE CURRENT ADJUSTMENT FOR PERSISTENT MEMORIES

(71) Applicant: Intel Corporation, Santa Clara, CA (US)

(72) Inventors: Yuanyuan Li, Campbell, CA (US); Rakan Maddah, Portland, OR (US); Prashant S. Damle, Portland, OR (US); Dany-Sebastien Ly-Gagnon, Santa Clara, CA (US); Lunkai Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 17/866,715

(22) Filed: Jul. 18, 2022

(65) Prior Publication Data

US 2022/0359030 A1     Nov. 10, 2022

(51) Int. Cl.
*G11C 29/12*          (2006.01)
*G11C 29/10*          (2006.01)
*G11C 29/18*          (2006.01)

(52) U.S. Cl.
CPC .......... *G11C 29/10* (2013.01); *G11C 29/1201* (2013.01); *G11C 29/18* (2013.01)

(58) Field of Classification Search
CPC ..... G11C 29/10; G11C 29/1201; G11C 29/18; G11C 29/028; G11C 2029/5006; G11C 29/021; G11C 29/50
See application file for complete search history.

(56) References Cited

U.S. PATENT DOCUMENTS

| | | | |
|---|---|---|---|
| 11,894,037 B2 | 2/2024 | Grobis et al. | |
| 2008/0123389 A1* | 5/2008 | Cho ................... | G11C 13/0064 365/163 |
| 2013/0010533 A1* | 1/2013 | Bedeschi ........... | G11C 13/0064 365/163 |
| 2016/0019959 A1* | 1/2016 | Takagi ............... | G11C 13/0069 365/148 |
| 2020/0051629 A1* | 2/2020 | Baek .................. | H10N 70/8836 |
| 2022/0359030 A1 | 11/2022 | Li et al. | |
| 2022/0415425 A1 | 12/2022 | Rao et al. | |

* cited by examiner

*Primary Examiner* — Mohammed A Bashar
(74) *Attorney, Agent, or Firm* — Compass IP Law PC

(57)          ABSTRACT
Systems, apparatuses, and methods provide for technology performs write current adjustment management in crosspoint persistent memory structures. Such technology determines whether to adjust a base current in response to a sampling of write-and-read operations on a set of addresses in a crosspoint persistent memory; determines whether a test current reduces a number of bit fails in response to a determination of whether to adjust the base current; and adjusts the base current based on the test current in response to a determination that the test current reduces the number of bit fails.

18 Claims, 6 Drawing Sheets

200

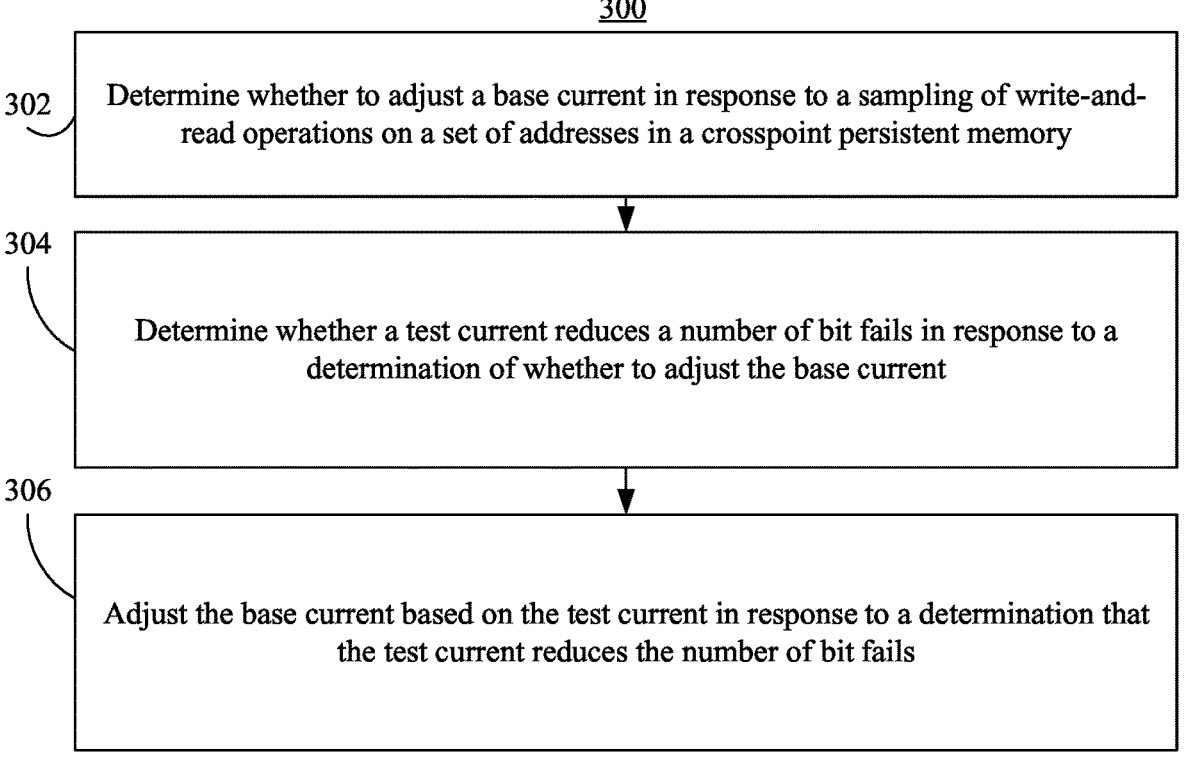

300

302  Determine whether to adjust a base current in response to a sampling of write-and-read operations on a set of addresses in a crosspoint persistent memory 304  Determine whether a test current reduces a number of bit fails in response to a determination of whether to adjust the base current 306  Adjust the base current based on the test current in response to a determination that the test current reduces the number of bit fails

Logic

Substrate(s)

502

ADAPTIVE WRITE CURRENT ADJUSTMENT FOR PERSISTENT MEMORIES

TECHNICAL FIELD

Embodiments generally relate to memory structures. More particularly, embodiments relate to write current adjustment management to improve performance in transistor-less persistent memory structures.

BACKGROUND

Some current strategies for transistor-less persistent memory include managing a reset current (RESET) at static predetermined points in the lifetime in the module. For example, such management of the RESET current at static predetermined points is typically done by applying predetermined reset current based on accumulated cycle counts (write counts). This scheme is typically referred to as a "Dynamic Ireset". Such a Dynamic Ireset current management scheme is typically determined empirically on a set of sample wafers that are manufactured with the same process as the parts that are sent to customers. Once determined, the Dynamic Ireset scheme is typically applied to all the dies, independently of an individual die's specific process and/or physical characteristics.

BRIEF DESCRIPTION OF THE DRAWINGS

The various advantages of the embodiments will become apparent to one skilled in the art by reading the following specification and appended claims, and by referencing the following drawings, in which:

FIG. 3 is a flowchart of an example of a method for write current adjustment management in transistor-less persistent memory structures according to an embodiment;

DESCRIPTION OF EMBODIMENTS

Figure 1:
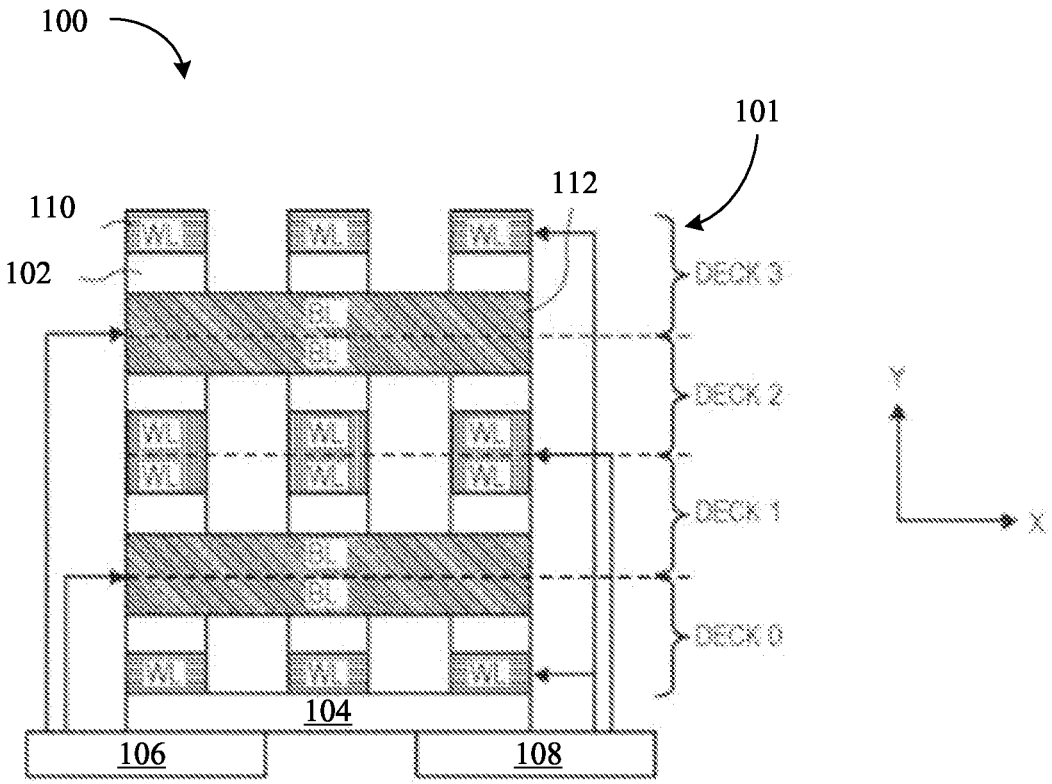
FIG. 1 is a block diagram of an example of a multi-deck non-volatile memory device according to an embodiment.

In some implementations described herein, persistent memory is implementable as a transistor-less persistent memory, such as a transistor-less stackable cross point architecture persistent memory or the like. Such transistor-less persistent memory is a byte addressable write-in-place nonvolatile memory that has memory cells (e.g., sitting at the intersection of word lines and bit lines) distributed across a plurality of storage dies and individually addressable, and in which bit storage is based on a change in bulk resistance and the like. In some implementations, such persistent memory includes single-level cell (SLC) memory, MLC (two level), TLC (three level), quad-level cell (QLC) memory, PLC (five level in development), three-dimensional (3D) crosspoint memory, INTEL OPTANE three-dimensional (3D) crosspoint memory, the like, and/or combinations thereof.

As described above, some current strategies for transistor-less persistent memory include managing a reset current (RESET) at static predetermined points in the lifetime in the module via a Dynamic Ireset current management scheme. However, for each change in process, as well as each periodical change, the Dynamic Ireset placement typically must be re-verified on a sample set of wafers to ensure that the RESET current enables most of the dies to sustain the required endurance capability.

More specifically, Dynamic Ireset placement is heavily cell or architecture changes dependent. For example, Dynamic Ireset placement is empirically determined from a subset of wafers which are similar to the final product. Accordingly, Dynamic Ireset placement will be a function of the cell stack and array operation parameters, such as cell size, top electrode thickness, current delivery, etc. This means Dynamic Ireset placement disadvantageously requires frequently calibration work, which increases potential error exposure for policy implementation.

Further, Dynamic Ireset imposes a fixed Ireset increase for all the dies at predetermined cycle counts. Such an approach ignores die to die variation and does not take into account the actual die state once integrated into the memory module product. Thus, Ireset is not optimized for each die. This also implies that dies that have slightly different physical characteristics will not be fully optimized. For example, zone-center dies, or edge dies typically show slight differences in their physical characteristics, but the Dynamic Ireset current management scheme disadvantageously does not account for those differences.

Moreover, Dynamic Ireset adjustments rely upon a fixed cycle count range. As a result, no finer steps adjustment is possible within the fixed cycle count range. Accordingly, Ireset is potentially not optimized when it needs to be adjusted.

Lastly, Dynamic Ireset is typically applied via firmware on a memory module. As a result, changes to the Ireset behavior at the component level will be propagated to firmware which disadvantageously requires code changes and maintenance.

As will be described in greater detail below, some implementations herein are directed to write current adjustment management to improve performance in transistor-less persistent memory structures.

Transistor-less persistent memory cells may have an ideal current operating point, and this ideal current operating point may increase or decrease through lifetime. If the ideal current operating point is too low, it will lead to reset fails. If it is too high, it may unnecessarily increase the energy required to operate the cell and/or affect cell reliability.

Accordingly, as will be described in greater detail below, notable reset fail reduction and/or energy improvements can be achieved when targeting the optimal current. When cells are receiving a current that is at least equal or higher than the optimal current, an increase in reset current will be unnecessary and not result in notable reset fails.

Further, high current RESET pulses are required in the functioning of transistor-less persistent memory products to transition a bit from "1" state to a "0" state. The RESET Current (Ireset) controls the amount of heat that is dissipated in the cell and provide full amorphization. Although RESET currents are determined at manufacturing, during the operation of the transistor-less persistent memory product, the RESET current needs to be typically increased, to account for an effective reduction in thermal efficiency, as the number of writes accumulated on the module increases, e.g., go from an early life towards end-of-life. The RESET current must be properly adjusted: Too high currents will degrade endurance capability, whereas too low currents will lead to RESET ("0") fails.

As will be described in greater detail below, some implementations herein focus on adaptively determining the optimal Ireset current for each device within a memory module. For example, such adaptive determination of the optimal Ireset current for each device is based on bit fails information determined by performing controlled writes and reads to gauge the effectiveness of the Ireset current to transition a cell state from "1" to "0". Such approaches allow some implementations herein to expand an expected lifetime through allowing cells to approach a best write endurance capability and minimize bit error rate at any point in the lifetime.

Advantageously for end customers, some implementations described herein will improve the reliability of transistor-less persistent memory products and enable the end-users to use the transistor-less persistent memory products for a longer lifetime with improved endurance. Additionally, or alternatively, some implementations herein advantageously reduce the complexity of the transistor-less persistent memory system policy and simplifies the qualification process by reducing the dependence on cell and process changes. Additionally, or alternatively, some implementations herein advantageously have the potential to improve device yield by approximately 15% by allowing each die to be tuned to its optimal RESET current, reducing impact of die-to-die variation, and enabling a more robust operational margin.

FIG. 1 is a block diagram of an example of a memory device 100 according to an embodiment. The memory device 100 is representative of one or more types of transistor-less persistent memory structures. In the illustrated example, the memory device 100 is a multi-deck non-volatile memory device including a plurality of decks 101 (e.g., Deck 0, Deck 1, Deck 2, and Deck 3, or the like).

In some implementations, each of the decks 101 may include an array of memory cells 102 with conductive access lines (e.g., wordlines 110 and bitlines 112). For example, the memory cells 102 may include a material capable of being in two or more stable states to store a logic value (e.g., a transistor-less persistent memory structure). In one example, the memory cells 102 may include a phase change material, a chalcogenide material, the like, or combinations thereof. However, any suitable storage material may be utilized. The wordlines 110 and bitlines 112 may be patterned so that the wordlines 110 are orthogonal to the bitlines 112, creating a grid pattern or "cross-points." A cross-point is an intersection between a bitline, a wordline, and active material(s) (e.g., a selector and/or a storage material). A memory cell 102 may be located at the intersection of a bitline 112 and a wordline 110. Accordingly, one or more of the decks 101 may include a crosspoint array of non-volatile memory cells, where each of the memory cells may include a material capable of being in two or more stable states (e.g., a transistor-less persistent memory structure) to store a logic value.

As illustrated, an electrically isolating material 104 may separate the conductive access lines (e.g., wordlines 110 and bitlines 112) of the bottom deck (e.g., deck 0) from bitline sockets 106 and wordline sockets 108. For example, the memory cells 102 may be coupled with access and control circuitry for operation of the three-dimensional memory device 100 via the bitline sockets 106 and the wordline sockets 108.

Examples of multi-deck or multi-layer memory architectures include multi-deck crosspoint memory and 3D NAND memory. Different memory technologies have adopted different terminology. For example, a deck in a crosspoint memory device typically refers to a layer of memory cell stacks that can be individually addressed. In contrast, a 3D NAND memory device is typically said to include a NAND array that includes many layers, as opposed to decks. In 3D NAND, a deck may refer to a subset of layers of memory cells (e.g., two decks of X-layers to effectively provide a 2X-layer NAND device). The term "deck" will be used throughout this disclosure to describe a layer, a tier, or a similar portion of a three-dimensional memory.

In operation, implementations described herein may be implemented in one or more memory devices. Such a memory device may include non-volatile memory (NVM) and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferro-electric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture (e.g., a transistor-less persistent memory structure) in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

The crosspoint memory array of FIG. 1 is one example of multi-deck non-volatile memory device 100, however, the techniques described herein may not be limited to crosspoint memory, but any memory device, including memory devices with a transistor-less persistent memory structure. Thus, memory systems may be designed to have one or more packages, each of which may include one or more memory dies. As will be described in greater detail below, systems, apparatuses and methods of some implementations herein provide for technology to perform write current adjustment management to improve performance in transistor-less persistent memory structures.

As will be described in greater detail below, systems, apparatuses and methods of some implementations herein provide for technology to perform write current adjustment management to improve performance in transistor-less persistent memory structures. For example, apparatuses and methods of some implementations herein provide for technology to adaptively calibrate an Ireset current through performing periodic controlled writes/reads to determine the raw bit error rate of writing a "0" state. In some examples, many writes/reads are performed to provide enough samples to assess the Reset state of the die. In some implementations, the sampling writes/reads are performed through a dedicated hardware (HW) module within the memory controller ASIC and get invoked through the firmware (FW) module. In such an example, the hardware module performs a write followed by a read when programmed by the firmware where the reads report the number of "0" bit fails as seen by the error correction scheme for each die in the module. Based on the number of "0" bit fails in the read operation, a subsequent "IRESET write" is performed with an adjusted (e.g., increased) Ireset current to see if the adjusted current reduces the number of bit fails. When a large number of write/read samples shows that increasing the reset current leads to writing "0" more reliably in a given die, a decision to adjust the Ireset current for that die is made and executed (e.g., via the firmware). As used herein, the term "IRESET write" is special device write that gets invoked through a dedicated command designed within and accepted by the memory component.

Figure 2:
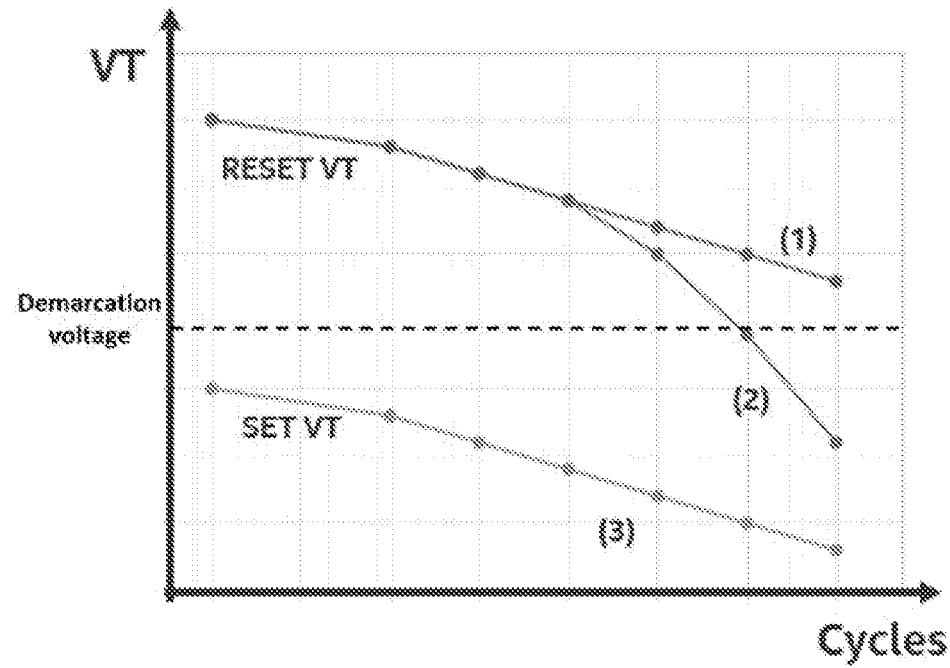
FIG. 2 is a diagram illustrating a set voltage and reset voltage evolution through repeated cycling according to an embodiment.

FIG. 2 is a diagram 200 illustrating a set voltage and reset voltage evolution through repeated cycling according to an embodiment. As illustrated, a "SET VT" distribution and a "RESET VT" distribution (e.g., for "1" and "0" bit states) change as a cell gets cycled over the lifetime of a memory device.

As illustrated, at early cycles, both set voltage and reset voltage shift down, retaining the operational window. As the cells approach end-of-life, lower than desired current puts cells in a under reset condition where cells cannot fully amorphized, which typically leads to reset fails. For example, reset fails involve failing to write "0" bits reliably and reading them back as "1". As illustrated, the reset voltage will start reducing faster than the SET VT due to intrinsic cell behavior without Ireset adjustment, effectively closing the operational window as seen in curve (2) of FIG. 2. When cells are in under reset condition, increasing Ireset will notably reduce "0" fails.

As will be discussed in greater detail below, applying an optimized reset current, typically increased Ireset for transistor-less (e.g., crosspoint) persistent memory, can advantageously mitigate undesired operational window closing, and recover the effective operational window (e.g., as shown in curve (1) of FIG. 2).

FIG. 3 is a flowchart of an example of a method 300 of write current adjustment management in crosspoint persistent memory structures according to an embodiment. The method 300 may generally be implemented in a device, such as, for example, a memory device (e.g., memory device 648 of FIG. 6), a memory controller (e.g., chip controller apparatus 650 of FIG. 6), and/or the like as discussed in greater detail below. Additionally, or alternatively, the method 300 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

Illustrated processing block 302 provides for determining whether to adjust a base current. For example, a determination of whether to adjust a base current is done in response to a sampling of write-and-read operations on a set of addresses in a crosspoint persistent memory, in some implementations.

Illustrated processing block 304 provides for determining whether a test current reduces a number of bit fails. For example, a determination of whether a test current reduces a number of bit fails is done in response to a determination of whether to adjust the base current, in some implementations.

Illustrated processing block 306 provides for adjusting the base current based on the test current. For example, adjusting the base current based on the test current is done in response to a determination that the test current reduces the number of bit fails, in some implementations.

Additional and/or alternative operations for method 300 are described in greater detail below in the description of and FIG. 4.

Figure 4:
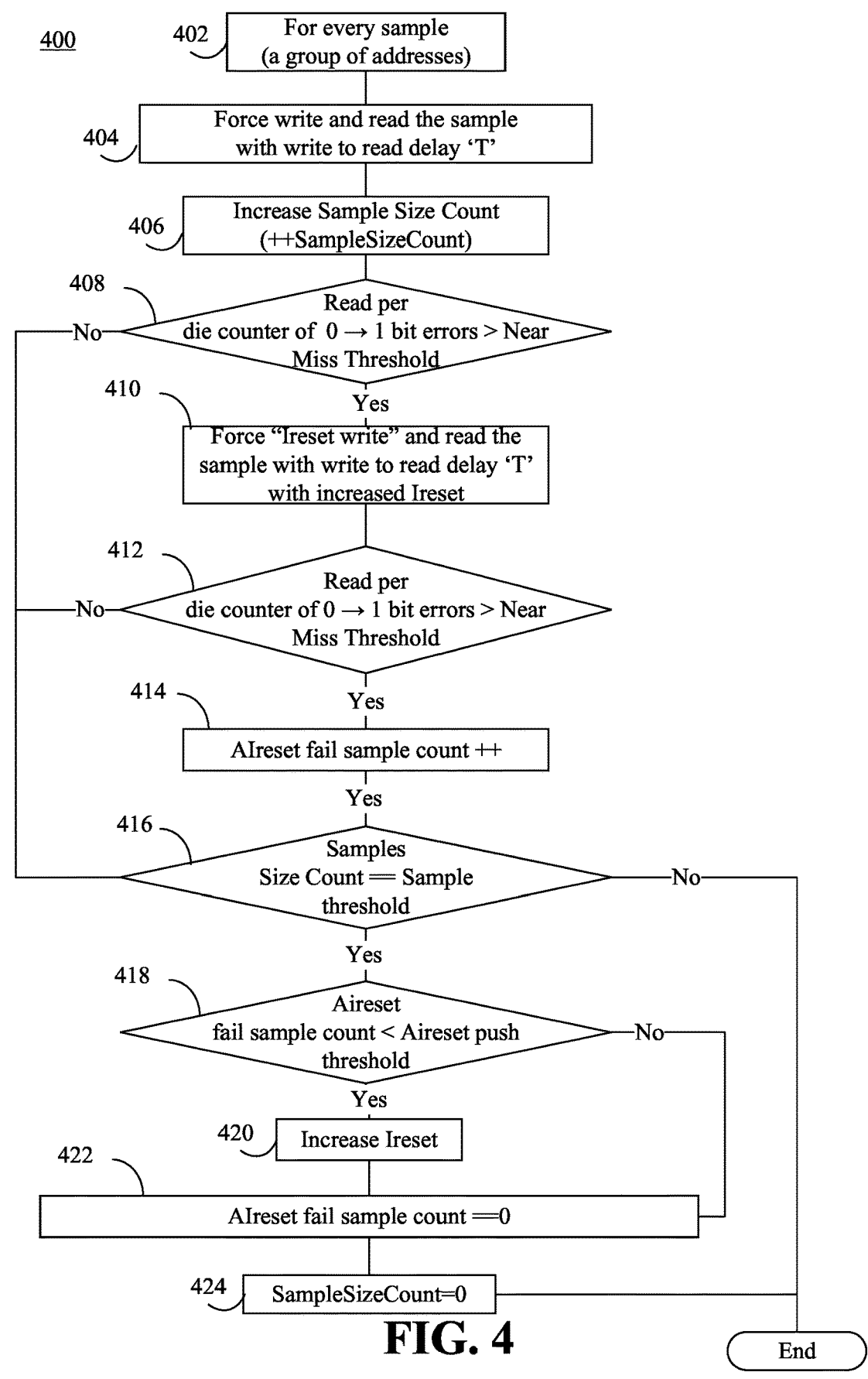
FIG. 4 is a flowchart of an example of a further method for write current adjustment management in transistor-less persistent memory structures according to an embodiment.

FIG. 4 is a flowchart of an example of a further method 400 of write current adjustment management in crosspoint persistent memory structures according to another embodiment. The method 400 may generally be implemented in a device, such as, for example, a memory device (e.g., memory device 648 of FIG. 6), a memory controller (e.g., chip controller apparatus 650 of FIG. 6), and/or the like as discussed in greater detail below. Additionally, or alternatively, the method 400 may be implemented in one or more modules as a set of logic instructions stored in a machine- or computer-readable storage medium such as random access memory (RAM), read only memory (ROM), programmable ROM (PROM), firmware, flash memory, etc., in configurable hardware such as, for example, programmable logic arrays (PLAs), field programmable gate arrays (FPGAs), complex programmable logic devices (CPLDs), in fixed-functionality hardware using circuit technology such as, for example, application specific integrated circuit (ASIC), complementary metal oxide semiconductor (CMOS) or transistor-transistor logic (TTL) technology, or any combination thereof.

A determination of whether a base current should be adjusted is done in response to a sampling of write-and-read operations on a set of addresses in a crosspoint persistent memory, in some implementations. Such operations are illustrated below by blocks 402-408.

Illustrated processing block 402 provides for determining a set of addresses to test. For example, a determination of a set of addresses to test is done in a crosspoint persistent memory, in some implementations.

Illustrated processing block 404 provides for performing a base sampling of write-and-read operations. For example, a performance of a base sampling of write-and-read operations is performed with a base current, in some implementations.

In some implementations, the performance of the base sampling is done with a predetermined write-to-read delay.

Illustrated processing block 406 provides for tracking a base sample count. For example, a tracking of a base sample count is associated with the base sampling, in some implementations.

Illustrated processing block 408 provides for determining whether a base zero bit fail amount associated with the base sampling exceeds a base near miss threshold. For example, a determination may be made as to whether a base zero bit fail amount associated with the base sampling exceeds a base near miss threshold on a die-by-die basis.

In some implementations, the determination of whether the base zero bit fail amount exceeds the base near miss threshold is performed on a die-by-die basis.

A determination of whether a test current reduces a number of bit fails is done in response to a determination that the base current should be adjusted, in some implementations. Such operations are illustrated below by blocks 410-414.

Illustrated processing block 410 provides for performing a test sampling of write-and-read operations with a test current. For example, performance of a test sampling of write-and-read operations with a test current is done in response to a determination that the base zero bit fail amount exceeds the base near miss threshold, in some implementations.

As used herein the term "near miss threshold" refers to a bit fail threshold (e.g., a number of bit fails), to determine whether an address read is showing enough number of "0" fails to be considered for a second write operation with increased Ireset current.

In some implementations, the performance of the test sampling is done with a predetermined write-to-read delay.

Illustrated processing block 412 provides for determining whether a test zero bit fail amount associated with the test sampling exceeds a test near miss threshold. For example, determining whether a test zero bit fail amount associated with the test sampling exceeds a test near miss threshold is done on a die-by-die basis.

In some implementations, the determination of whether the test zero bit fail amount exceeds the test near miss threshold is performed on a die-by-die basis.

Illustrated processing block 414 provides for tracking a test fail count associated with the test sampling. For example, tracking a test fail count associated with the test sampling is done in response to a determination that the test zero bit fail amount exceeds the test near miss threshold, in some implementations.

As used herein the term "near miss threshold" refers to a bit fail threshold (e.g., a number of bit fails), to determine whether an address read is showing enough number of "0" fails to be considered for a second write operation with increased Ireset current.

An increase of the base current based on the test current is done in response to a determination that the test current reduces the number of bit fails, in some implementations. Such operations are illustrated below by blocks 416-420.

Illustrated processing block 416 provides for determining whether the base sample count meets a sample threshold.

As used herein the term "sample threshold" refers to a minimum required number of sampled writes/reads to be performed.

Illustrated processing block 418 provides for determining whether the test fail count exceeds a current reset threshold. For example, determining whether the test fail count exceeds a current reset threshold is done in response to a determination that the base sample count meets the sample threshold and in response to the determination that the test zero bit fail amount exceeds the test near miss threshold, in some implementations.

As used herein the term "current reset threshold" refers to a threshold number of the sampled write/reads that showed bit fails more than a near miss threshold with an adjusted (e.g., increased) Ireset for a decision to adjust a default base Ireset level. In some instances, the term "current reset threshold" is described herein as an "Aireset push threshold." For example, the Ireset should be increased when a test fail count is less than the current reset threshold. In another word, base current is adjusted (e.g., increased) when increased Ireset reduces test fail counts below the threshold.

Illustrated processing block 420 provides for adjusting the base current based on the test current. For example, adjusting the base current based on the test current is done in response to a determination that the test fail count does not exceed the current reset threshold on a die-by-die basis.

In some implementations, the operation to adjust the base current is performed on a die-by-die basis.

Illustrated processing block 422 provides for resetting the test fail count to zero. For example, resetting the test fail count to zero is done in response to the operation to adjust the base current or in response to a determination that the test fails count does exceed the current reset threshold, in some implementations.

Illustrated processing block 424 provides for resetting the base sample count to zero. For example, resetting the base sample count to zero is done in response to the reset of the test fail count to zero, in some implementations.

In operation, the idea of adaptive current is to adaptively find optimized Ireset for each die in real time through tracking the bit error rate induced by reset fails ("0" bit fails). To achieve this goal, some implementations herein perform periodic sampling writes/reads with two sets of Ireset: the default Ireset current used for all module writes and an adjusted Ireset with a certain offset to default Ireset used only for the sampling writes. The first write is used to gauge the raw bit error of a "0" bit state while the second write to the same address is performed with an adjusted Ireset current to determine whether the error rate detected in the first write is reduced. If a larger number of sampled adjusted Ireset writes show reduced error rate, then the default Ireset current gets adjusted.

In some examples, memory device and memory controller features may be required to be modified with configurability through the firmware software module. First, memory device circuitry is modified to support two writes with different Ireset current (e.g., (1) a write with a default Ireset current and (2) a write with a higher reset current relative to the default Ireset current). In such an example, the device addressing protocol must support both writes flavors through unique command protocol. Additionally, or alternatively, a hardware module within the ASIC of a memory controller is modified to issue controlled sampling writes/ read with a specific write to read delay where reads report the number of "0" bit fails. In such an example, the hardware module provides write command configurability to select whether a regular write or an "increased Ireset" write is to be issued.

In some implementations, the adjustment of the write Ireset current is specified through a firmware level media management policy that defines the frequency of the sampling writes/reads and the criteria to adjust write Ireset current. In such an example, the policy defines the flowing key parameters a near miss threshold (e.g., a base near miss threshold and a test near miss threshold, which may be the same or different values), a sample threshold, and a current reset threshold. As used herein the term "near miss threshold" refers to a bit fail threshold (e.g., a number of bit fails), to determine whether an address read is showing enough number of "0" fails to be considered for a second write operation with increased Ireset current. As used herein the term "sample threshold" refers to a minimum required number of sampled writes/reads to be performed. As used herein the term "current reset threshold" refers to a threshold number of the sampled write/reads that showed bit fails more than a near miss threshold with an adjusted (e.g., increased) Ireset for a decision to adjust a default base Ireset level. In some instances, the term "current reset threshold" is described herein as an "Aireset push threshold."

Additional details regarding the various implementations of method 400 are discussed below with regard to FIGS. 5 and 6.

Figure 5:
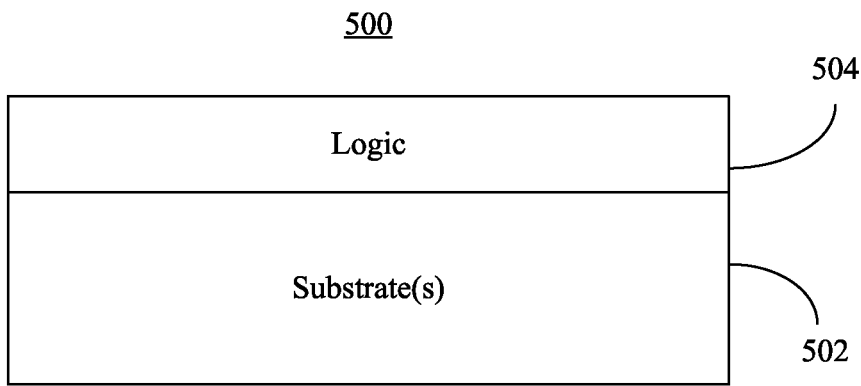
FIG. 5 is an illustration of an example of a semiconductor package apparatus according to an embodiment.

FIG. 5 shows a semiconductor apparatus 500 (e.g., chip, die, and/or package). The illustrated apparatus 500 includes one or more substrates 502 (e.g., silicon, sapphire, gallium arsenide) and logic 504 (e.g., transistor array and other integrated circuit/IC components) coupled to the substrate(s) 502. In an embodiment, the logic 504 implements one or more aspects of the method 300 (FIG. 3) and/or the method 400 (FIG. 4), already discussed.

Thus, the logic 504 is to perform write current adjustment management in crosspoint persistent memory structures. In some implementations, the logic 504 determines whether to adjust a base current in response to a sampling of write-and-read operations on a set of addresses in a crosspoint persistent memory; determines whether a test current reduces a number of bit fails in response to a determination of whether to adjust the base current; and adjusts the base current based on the test current in response to a determination that the test current reduces the number of bit fails.

In one example, the logic 504 includes transistor channel regions that are positioned (e.g., embedded) within the substrate(s) 502. Thus, the interface between the logic 504 and the substrate 502 may not be an abrupt junction. The logic 504 may also be considered to include an epitaxial layer that is grown on an initial wafer of the substrate 502.

Figure 6:
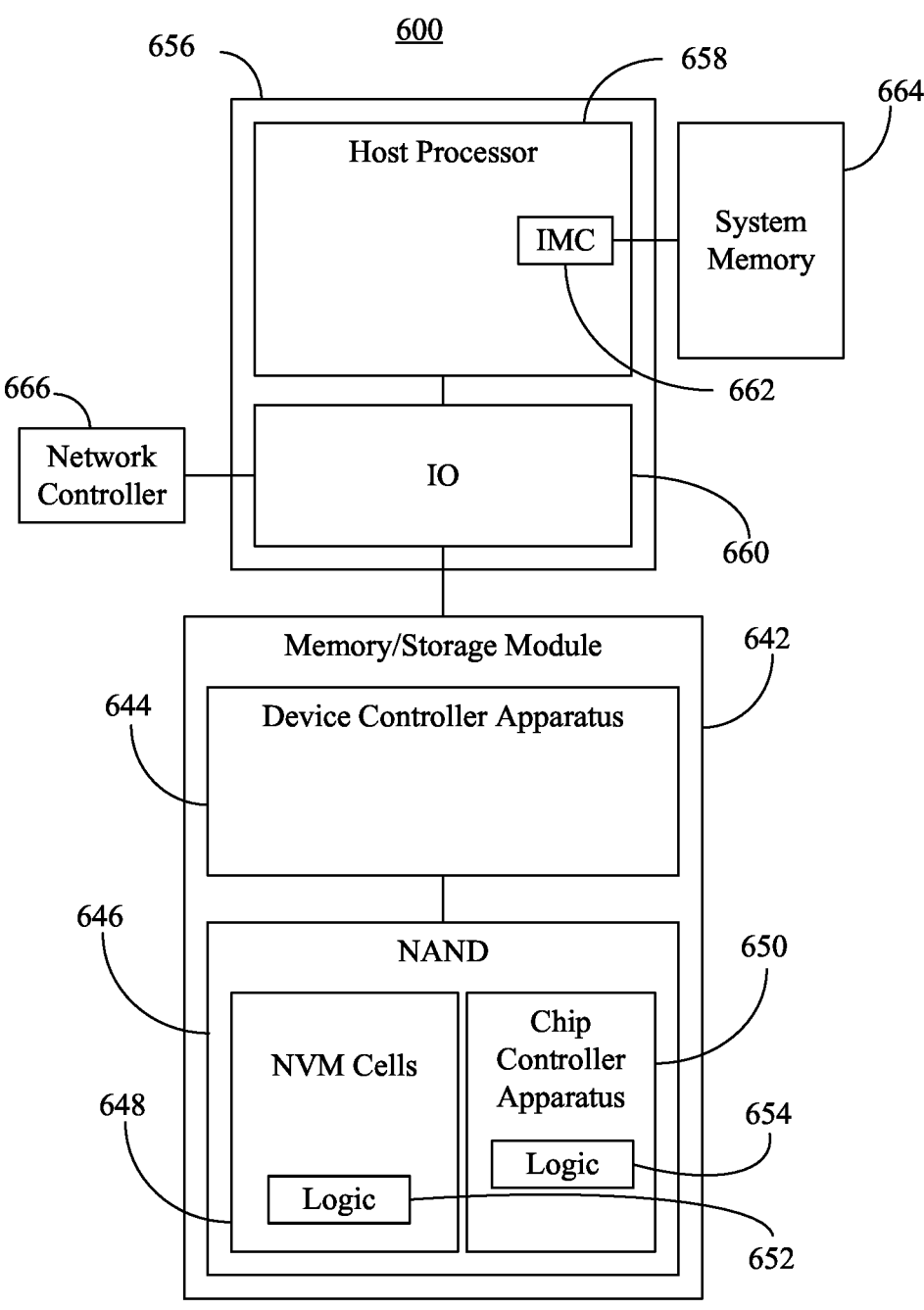
FIG. 6 is a block diagram of an example of a performance-enhanced computing system according to an embodiment.

Turning now to FIG. 6, a performance-enhanced computing system 640 is shown. In the illustrated example, a solid state drive (SSD) 642 includes a device controller apparatus 644 that is coupled to a NAND 646. The illustrated NAND 646 includes a memory device 648 having a set of multi-level NVM cells and logic 652 (e.g., transistor array and other integrated circuit/IC components coupled to one or more substrates containing silicon, sapphire and/or gallium arsenide), and a chip controller apparatus 650 that includes logic 654. The logic 654, which may include one or more of configurable or fixed-functionality hardware, may be configured to perform one or more aspects of the method 300 (FIG. 3) and/or the method 400 (FIG. 4), already discussed.

Thus, the logic 652 is to perform write current adjustment management in crosspoint persistent memory structures. In some implementations, the logic 652 determines whether to adjust a base current in response to a sampling of write-and-read operations on a set of addresses in a crosspoint persistent memory; determines whether a test current reduces a number of bit fails in response to a determination of whether to adjust the base current; and adjusts the base current based on the test current in response to a determination that the test current reduces the number of bit fails.

In one example, NAND 646 includes a memory array having a plurality of cell blocks (e.g., NVM cells and logic 652). In such an example, a memory controller (e.g., chip controller apparatus 650) is coupled to the memory array.

The illustrated system 640 also includes a system on chip (SoC) 656 having a host processor 658 (e.g., central processing unit/CPU) and an input/output (I/O) module 660. The host processor 658 may include an integrated memory controller 662 (IMC) that communicates with system memory 664 (e.g., RAM dual inline memory modules/ DIMMs). The illustrated IO module 660 is coupled to the SSD 642 as well as other system components such as a network controller 666.

ADDITIONAL NOTES AND EXAMPLES

Example 1 includes a semiconductor apparatus comprising: one or more substrates; and logic coupled to the one or more substrates, wherein the logic is implemented at least partly in one or more of configurable or fixed-functionality hardware. The logic is to: determine whether to adjust a base current in response to a sampling of write-and-read operations on a set of addresses in a crosspoint persistent memory; determine whether a test current reduces a number of bit fails in response to a determination whether to adjust the base current; and adjust the base current based on the test current in response to a determination that the test current reduces the number of bit fails.

Example 2 includes the semiconductor apparatus of Example 1, wherein the determination of whether to adjust the base current further comprises operations to: determine the set of addresses to test in the crosspoint persistent memory; perform a base sampling of write-and-read operations with the base current; track a base sample count associated with the base sampling; and determine whether a base zero bit fail amount associated with the base sampling exceeds a base near miss threshold.

Example 3 includes the semiconductor apparatus of any one of Examples 1 to 2, wherein the determination of whether to adjust the base current is performed on a die-by-die basis.

Example 4 includes the semiconductor apparatus of Example 1, wherein the determination of whether the test current reduces the number of bit fails further comprises operations to: perform a test sampling of write-and-read operations with the test current in response to a determination that a base zero bit fail amount exceeds a base near miss threshold; determine whether a test zero bit fail amount associated with the test sampling exceeds a test near miss threshold; and track a test fail count associated with the test sampling in response to a determination that the test zero bit fail amount exceeds the test near miss threshold.

Example 5 includes the semiconductor apparatus of any one of Examples 1 to 4, wherein the determination of whether the test current reduces the number of bit fails is performed on a die-by-die basis.

Example 6 includes the semiconductor apparatus of Example 2, wherein the operation to adjust the base current further comprises operations to: determine whether the base sample count meets a sample threshold.

Example 7 includes the semiconductor apparatus of Example 4, wherein the operation to adjust the base current further comprises operations to: determine whether the test fail count does not exceed a current reset threshold.

Example 8 includes the semiconductor apparatus of Example 1, wherein the operation to adjust the base current further comprises operations to: determine whether a base sample count meets a sample threshold; determine whether a test fail count exceeds a current reset threshold in response to a determination that the base sample count meets the sample threshold and in response to a determination that a test zero bit fail amount exceeds a test near miss threshold; wherein the operation to adjust the base current is done in response to a determination that the test fail count does not exceed the current reset threshold.

Example 9 includes the semiconductor apparatus of Example 1, wherein the operation to adjust the base current further comprises operations to: reset the test fail count to zero in response to the operation to adjust the base current or in response to a determination that the test fail count exceeds the current reset threshold; and reset the based sample count to zero in response to the reset of the test fail count to zero.

Example 10 includes the semiconductor apparatus of any one of Examples 1 to 9, wherein the operation to adjust the base current is performed on a die-by-die basis.

Example 11 includes a computing system comprising: a memory array including a plurality of cell blocks in a crosspoint persistent memory; and a memory controller coupled to the memory array. The memory controller is to: determine whether to adjust a base current in response to a sampling of write-and-read operations on a set of addresses in the crosspoint persistent memory; determine whether a test current reduces a number of bit fails in response to a determination of whether to adjust the base current; and adjust the base current based on the test current in response to a determination that the test current reduces the number of bit fails.

Example 12 includes the computing system of Example 11, wherein the determination of whether to adjust the base current further comprises operations to: determine the set of addresses to test in the crosspoint persistent memory; perform a base sampling of write-and-read operations with the base current; track a base sample count associated with the base sampling; and determine whether a base zero bit fail amount associated with the base sampling exceeds a base near miss threshold, wherein the determination of whether to adjust the base current is performed on a die-by-die basis.

Example 13 includes the computing system of any one of Examples 12 to 13, wherein the determination of whether the test current reduces the number of bit fails further comprises operations to: perform a test sampling of write-and-read operations with the test current in response to a determination that the base zero bit fail amount exceeds the base near miss threshold.

Example 14 includes the computing system of Example 11, wherein the determination of whether the test current reduces the number of bit fails further comprises operations to: perform a test sampling of write-and-read operations with the test current in response to a determination that a base zero bit fail amount exceeds a base near miss threshold; determine whether a test zero bit fail amount associated with the test sampling exceeds a test near miss threshold; and track a test fail count associated with the test sampling in response to a determination that the test zero bit fail amount exceeds the test near miss threshold, wherein the determination of whether the test current reduces the number of bit fails is performed on a die-by-die basis.

Example 15 includes the computing system of Example 12, wherein the operation to adjust the base current further comprises operations to: determine whether the base sample count meets a sample threshold.

Example 16 includes the computing system of Example 14, wherein the operation to adjust the base current further comprises operations to: determine whether the test fail count does not exceed a current reset threshold.

Example 17 includes the computing system of Example 11, wherein the operation to adjust the base current further comprises operations to: determine whether a base sample count meets a sample threshold; determine whether a test fail count exceeds a current reset threshold in response to a determination that the base sample count meets the sample threshold and in response to a determination that a test zero bit fail amount exceeds a test near miss threshold; wherein the operation to adjust the base current is done in response to a determination that the test fail count does not exceed the current reset threshold, and wherein the operation to adjust the base current is performed on a die-by-die basis.

Example 18 includes the computing system of Example 11, wherein the operation to adjust the base current further comprises operations to: reset the test fail count to zero in response to the operation to adjust the base current or in response to a determination that the test fail count exceeds the current reset threshold; and reset the based sample count to zero in response to the reset of the test fail count to zero.

Example 19 includes a method comprising: determining whether to adjust a base current in response to a sampling of write-and-read operations on a set of addresses in a crosspoint persistent memory; determining whether a test current reduces a number of bit fails in response to a determination of whether to adjust the base current; and adjusting the base current based on the test current in response to a determination that the test current reduces the number of bit fails.

Example 20 includes the method of Example 19, wherein the determining of whether to adjust the base current further comprises: determining the set of addresses to test in the crosspoint persistent memory; performing a base sampling of write-and-read operations with the base current; tracking a base sample count associated with the base sampling; and determining whether a base zero bit fail amount associated with the base sampling exceeds a base near miss threshold, wherein the determination of whether to adjust the base current adjusted is performed on a die-by-die basis.

Example 21 includes an apparatus comprising means for performing the method of any one of Examples 19 to 20.

Example 22 includes a machine-readable storage comprising machine-readable instructions which, when executed, implement the method of any one of Examples 19 to 20.

Technology described herein therefore advantageously provides the capability to improve performance reliability of crosspoint persistent memory products and enable the end-users to use the crosspoint persistent memory products for a longer lifetime with improved endurance. Additionally, or alternatively, some implementations herein advantageously reduce the complexity of the crosspoint persistent memory system policy and simplifies the qualification process by reducing the dependence on cell and process changes. Additionally, or alternatively, some implementations herein advantageously have the potential to improve device yield by approximately 15% by allowing each die to be tuned to its optimal RESET current, reducing impact of die-to-die variation, and enabling a more robust operational margin.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, e.g., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc.

may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory module comprising:
a memory array including a plurality of cell blocks in a crosspoint persistent memory; and
a chip controller coupled to the memory array, the chip controller to:
perform a base sampling of write-and-read operations with a base reset current on a set of addresses in the crosspoint persistent memory;
determine whether a zero bit error rate for the base sampling exceeds a threshold;
perform a test sampling of write-and-read operations with a test reset current that is increased relative to the base reset current;
determine whether the zero bit error rate decreases with the test reset current for the test sampling; and
adjust the base reset current to the test reset current in response to a determination that the test reset current reduces the zero bit error rate.

2. The memory module of claim 1, wherein the chip controller is further to:
determine the set of addresses to test in the crosspoint persistent memory; and
track a base sample count associated with the base sampling.

3. The memory module of claim 1, wherein the memory array comprises a memory array spread over multiple memory dies, and wherein the test sampling, determination of whether the zero bit error rate decreases, and adjustment of the base reset current are performed on a die-by-die basis.

4. The memory module of claim 2, wherein the chip controller is to:
perform the base sampling until the base sample count meets a sample threshold.

5. The memory module of claim 1, wherein the chip controller is to:
adjust the base reset current only when the zero bit error rate is reduced below a current reset threshold.

6. The memory module of claim 2, wherein the chip controller is to:
reset the base sample count to zero in response to adjusting the base reset current.

7. A computing system comprising:
a memory array including a plurality of cell blocks in a crosspoint persistent memory; and
a memory controller coupled to the memory array, the memory controller to:
perform a base sampling of write-and-read operations with a base reset current on a set of addresses in the crosspoint persistent memory;

determine whether a zero bit error rate for the base sampling exceeds a threshold;

perform a test sampling of write-and-read operations with a test reset current that is increased relative to the base reset current;

determine whether the zero bit error rate decreases with the test reset current for the test sampling; and adjust the base reset current to the test reset current in response to a determination that the test reset current reduces the zero bit error rate.

8. The computing system of claim 7, wherein the memory array comprises a memory array spread over multiple memory dies, and wherein the memory controller is further to:

determine the set of addresses to test in the crosspoint persistent memory; and track a base sample count associated with the base sampling, wherein the test sampling, determination of whether the zero bit error rate decreases, and adjustment of the base reset current is performed on a die-by-die basis.

9. The computing system of claim 7, wherein the test sampling, determination of whether the zero bit error rate decreases, and adjustment of the base reset current are performed on a die-by-die basis.

10. The computing system of claim 8, wherein the memory controller is to:

perform the base sampling until the base sample count meets a sample threshold.

11. The computing system of claim 7, wherein the memory controller is to:

adjust the base reset current only when the zero bit error rate is reduced below a current reset threshold.

12. The computing system of claim 8, wherein the memory controller is to:

reset the base sample count to zero in response to adjusting the base reset current.

13. A method comprising:

performing a base sampling of write-and-read operations with a base reset current on a set of addresses in a crosspoint persistent memory;

determining whether a zero bit error rate for the base sampling exceeds a threshold;

performing a test sampling of write-and-read operations with a test reset current that is increased relative to the base reset current;

determining whether the zero bit error rate decreases with the test reset current for the test sampling; and adjusting the base reset current to the test reset current in response to a determination that the test reset current reduces the zero bit error rate.

14. The method of claim 13, further comprising:

determining the set of addresses to test in the crosspoint persistent memory; and tracking a base sample count associated with the base sampling.

15. The method of claim 13, wherein the crosspoint persistent memory includes a memory array spread over multiple memory dies, and wherein the test sampling, determination of whether the zero bit error rate decreases, and adjustment of the base reset current are performed on a die-by-die basis.

16. The method of claim 14, wherein performing the test sampling comprises:

performing the base sampling until the base sample count meets a sample threshold.

17. The method of claim 13, wherein adjusting the base reset current comprises:

adjusting the base reset current only when the zero bit error rate is reduced below a current reset threshold.

18. The method of claim 14, further comprising:

resetting the base sample count to zero in response to adjusting the base reset current.

* * * * *